United States Patent
Kanno et al.

(10) Patent No.: US 10,790,111 B2
(45) Date of Patent: Sep. 29, 2020

(54) CHARGED-PARTICLE BEAM DEVICE

(71) Applicant: Hitachi High-Tech Corporation, Minato-ku, Tokyo (JP)

(72) Inventors: Seiichiro Kanno, Tokyo (JP); Hiroyuki Andou, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/479,356

(22) PCT Filed: Feb. 24, 2017

(86) PCT No.: PCT/JP2017/007085
§ 371 (c)(1),
(2) Date: Jul. 19, 2019

(87) PCT Pub. No.: WO2018/154706
PCT Pub. Date: Aug. 30, 2018

(65) Prior Publication Data
US 2019/0355541 A1 Nov. 21, 2019

(51) Int. Cl.
*H01J 37/02* (2006.01)
*H01J 37/20* (2006.01)

(52) U.S. Cl.
CPC ............ *H01J 37/026* (2013.01); *H01J 37/20* (2013.01); *H01J 2237/202* (2013.01); *H01J 2237/2007* (2013.01); *H01J 2237/24564* (2013.01)

(58) Field of Classification Search
USPC .......................... 250/440.11, 441.11, 442.11
See application file for complete search history.

(56) References Cited

U.S. PATENT DOCUMENTS

| | | | |
|---|---|---|---|
| 9,543,113 B2 | 1/2017 | Ebizuka et al. | |
| 2005/0016685 A1* | 1/2005 | Emoto | G03F 7/70708 156/345.51 |

(Continued)

FOREIGN PATENT DOCUMENTS

| | | |
|---|---|---|
| JP | 2007-53405 A | 3/2007 |
| JP | 2014-137905 A | 7/2014 |
| WO | WO 2015/163036 A1 | 10/2015 |

OTHER PUBLICATIONS

International Search Report (PCT/ISA/210) issued in PCT Application No. PCT/JP2017/007085 dated Jun. 20, 2017 with English translation (five (5) pages).

(Continued)

*Primary Examiner* — Kiet T Nguyen
(74) *Attorney, Agent, or Firm* — Crowell & Moring LLP

(57) ABSTRACT

The objective of the present invention is to provide a charged-particle beam device wherein suppressing the effects of static build-up is compatible with executing high-throughput measurements and examination. In order to achieve this objective, proposed is the charged-particle beam device equipped with an electrostatic chuck (803), comprising an electrometer (11) for measuring the electric potential of the electrostatic chuck, a charge removing device (805) for removing charge from the electrostatic chuck, and a control device (806) for controlling the charge removing device in such a manner that the charge removal by the charge removing device is executed after reaching a certain number of processed samples irradiated by the charged particle beam, or after a predetermined processing time. When the result of the electric potential measurement by the electrometer does not meet a predetermined condi- (Continued)

tion, the control device executes at least one among increasing and decreasing the number processed or the processing time.

11 Claims, 8 Drawing Sheets

(56) References Cited

U.S. PATENT DOCUMENTS

2005/0152088 A1* 7/2005 Ito .................. G03F 7/70783
       361/233
2011/0303844 A1* 12/2011 Kanno .............. G01R 31/307
       250/307

OTHER PUBLICATIONS

Japanese-language Written Opinion (PCT/ISA/237) issued in PCT Application No. PCT/JP2017/007085 dated Jun. 20, 2017 (four (4) pages).

\* cited by examiner

CHARGED-PARTICLE BEAM DEVICE

TECHNICAL FIELD

The present invention relates to a charged-particle beam device that irradiates a sample with a charged particle beam, and particularly to a charged-particle beam device equipped with an electrostatic chuck mechanism that holds a sample to be irradiated by a beam.

BACKGROUND ART

Some scanning electron microscopes that execute measurement and examination of a semiconductor wafer include an electrostatic chuck mechanism that holds the semiconductor wafer when the semiconductor wafer is irradiated by a beam. Since a sample chucking surface of the electrostatic chuck is formed of an insulation material, charge caused by friction or the like with a sample may be accumulated during sample chucking. Patent Literature 1 discloses a charged-particle beam device that measures electric potential on a surface side of an electrostatic chuck and executes charge removal when the electric potential exceeds a predetermined value.

PRIOR ART LITERATURE

Patent Literature

PTL 1: JP-A-2014-137905 (corresponding to U.S. Pat. No. 9,543,113)

SUMMARY OF INVENTION

Technical Problem

As disclosed in Patent Literature 1, by executing the charge removal based on measurement of the electric potential of the sample, measurement and examination of the semiconductor wafer can be executed while suppressing effects of charge. However, during the charge measurement and charge removal, the measurement and examination based on beam irradiation cannot be executed, and therefore, processing capability of the device is reduced. Since a high throughput is requested for a scanning electron microscope used for measurement and examination of a semiconductor device, it is required that maintaining or improving throughput is compatible with suppressing the effects of charge.

Hereinafter, a charged-particle beam device will be described, and a first object thereof is suppressing the effects of charge being compatible with performing high-throughput measurements and examination. In addition, a charged-particle beam device will be described, and a second object thereof is to execute charge measurement with high sensitivity.

Solution to Problem

As one aspect for achieving the first object, there is proposed a charged-particle beam device equipped with an electrostatic chuck, which includes: an electrometer that measures electric potential of the electrostatic chuck; a charge removing device that removes charge from the electrostatic chuck; and a control device that controls the charge removing device in such a manner that charge removal by the charge removing device is executed after reaching a predetermined processed number of samples irradiated by the charged particle beam, or after a predetermined processing time, in which the control device executes at least one among increasing and decreasing the processed number or processing time when a result of electric potential measurement by the electrometer does not meet a predetermined condition.

As one aspect for achieving the second object, there is proposed a charged-particle beam device equipped with an electrostatic chuck, which includes: a stage that moves the electrostatic chuck; an electrometer that measures electric potential of the electrostatic chuck; and a control device that controls the stage and the electrometer, in which a sample chucking surface of the electrostatic chuck includes a first region in which a plurality of projections are formed and a second region in which the number of projections per unit area is larger than that of the first region, and the control device controls the stage and the electrometer so as to measure electric potential of the second region.

Advantageous Effect

According to the above configuration, suppressing the effects of charge can be compatible with performing high-throughput measurements and examination. In addition, the charge measurement can be executed with high sensitivity.

DESCRIPTION OF EMBODIMENTS

Figure 1:
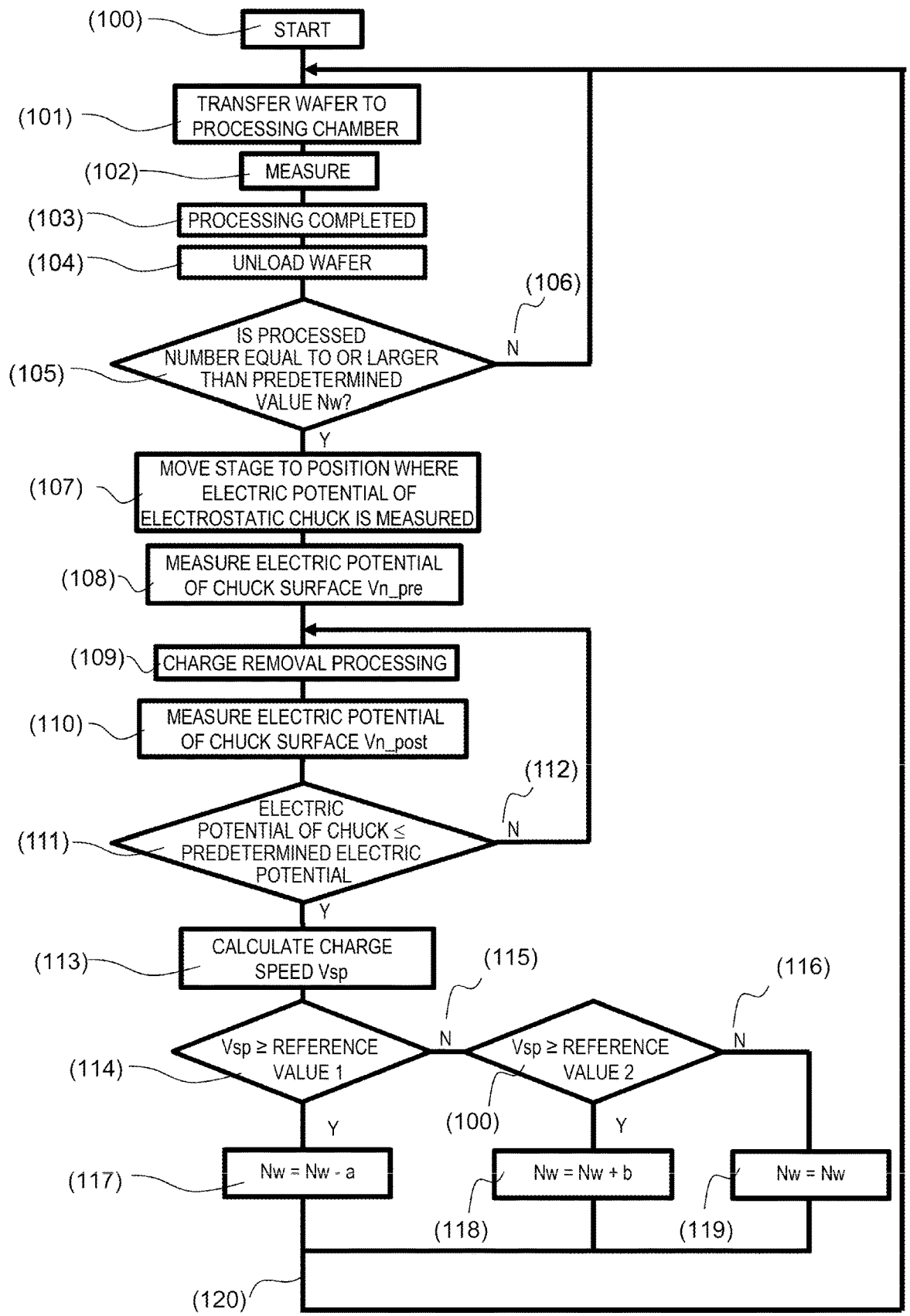
FIG. 1 is a flowchart showing steps of adjusting a charge removal timing using a charge removing device according to a charge speed (first embodiment).

In recent years, an electron microscope is applied to dimension measurement and defect examination of a semiconductor device pattern. For example, a critical-dimension scanning electron microscope (hereinafter referred to as a CD-SEM), which is a type of charged-particle beam device, is used to measure a gate dimension of a semiconductor device, and a defect examination SEM is used for defect examination. In addition, a scanning electron microscope is used for conduction examination of deep holes for wiring using electric potential contrast.

As an example, a basic principle of measurement is briefly explained with reference to the CD-SEM as an example. An image acquisition method is basically the same as that of the scanning electron microscope. Primary electrons are emitted from an electron gun and accelerated by being applied with a voltage. Then, a beam diameter of an electron beam is narrowed by an electromagnetic lens. A sample such as a semiconductor wafer is two-dimensionally scanned with the electron beam. Secondary electrons generated by incidence of the scanning electron beam on the sample are detected by a detector. Since intensity of the secondary electrons reflects a shape of a sample surface, a fine pattern on the sample can be imaged by displaying the scanning of the electron beam and the detection of the secondary electrons on a monitor in synchronization with each other. For example, when a line width of a gate electrode is measured by the CD-SEM, an edge of a pattern is determined based on a change in light and shade of an obtained image to derive a dimension. The measurement principle of the CD-SEM is to measure a position predetermined by a user in a surface of the semiconductor wafer by moving a stage.

The CD-SEM is used for the dimension measurement of the device pattern in a semiconductor manufacturing line, and therefore, not only performance as an electron microscope such as resolution and length measurement reproducibility, and throughput that represents processing capacity per unit time, are important, but long time stable operation of the device is also extremely important.

It is desirable to use an electrostatic chuck to hold the wafer to be measured or examined. This is because the wafer warped by a film formation process and the like is fixed while being corrected by an electrostatic force, and the throughput can be ensured by moving the stage at a high speed. On the other hand, since a surface of the electrostatic chuck is a ceramic having a high resistance, an chucking surface thereof is charged. When the charge progresses, the wafer may be electrostatically chucked unintentionally, resulting in residual chucking. If the wafer is lifted up against a force after completion of processing in a state of the residual chucking, the wafer may bounce at the moment of peeling off and cause transfer errors. Since the wafer may be damaged, it is extremely important to stably operate the device to avoid the residual chucking.

A residual chucking force is generated by the charge on the surface of the electrostatic chuck reaching a certain level or more. It is considered that the charge on the surface of electrostatic chuck may be caused by frictional charge due to contact between the wafer and the electrostatic chuck, charge due to flow and accumulation of minute leak currents on the surface by applying a voltage to the electrostatic chuck, charge due to ionization of minute emission gas released from an inner surface of the wafer, and the like.

Therefore, in order to stably operate the device, it is necessary to operate while maintaining the charge on the surface of the chuck at a certain level or less. For this reason, it is desirable to monitor the surface of the chuck (sample chucking surface) at appropriate timing to execute the charge removal. However, it is difficult to monitor the charge of the electrostatic chuck and execute the charge removal at the appropriate timing in practice. Further, in a case where the charge removal is executed periodically and in a case where the charge removal is executed by monitoring the charge by a surface electric potential sensor, it is desirable to operate with an appropriate execution timing. Particularly, in the case where the charge removal is executed periodically, if a large amount of charge is attached between the completion of one charge removal and the execution of the next charge removal, the processing is continued until the next charge removal with the possibility of transfer errors or wafer breakage. It is conceivable to prevent the large amount of charge from being attached to the sample chucking surface by executing the charge removal at a high frequency, but operation time of the measurement and examination device is reduced. Therefore, it is desirable to reduce the frequency of the charge removal while preventing generation of transfer errors or the like.

Hereinafter, a scanning electron microscope which can accurately measure a surface of an electrostatic chuck with high sensitivity will be mainly described. In addition, a scanning electron microscope which can measure electric potential of an electrostatic chuck before and after charge removal execution and automatically review a cumulative processed number until the next charge removal is executed based on a charge state from the last charge removal execution will be described. Further, a scanning electron microscope will be described, in which the possibility of transfer errors or wafer breakage is reduced even in a case where the electrostatic chuck is unexpectedly charged.

In embodiments to be described later, a scanning electron microscope, for example, in a scanning electron microscope including an electrostatic chuck with projections for supporting a wafer on a surface thereof so as to measure electric potential with high sensitivity, density of the projections in a region for measuring a surface of the electrostatic chuck with a surface electrometer being greater than other regions, will be described. In addition, a scanning electron microscope, which measures electric potential of an electrostatic chuck at least before charge removal is executed, and automatically reviews a cumulative processed number or period until the next charge removal execution according to a charge progress in a period after the last charge removal execution, will be described. Further, a scanning electron microscope in which charge removal execution is determined based on a cumulative processing time or the presence or absence of the residual chucking force in addition to a cumulative processed number, will be described.

According to the above configuration, since the electric potential of the surface of the electrostatic chuck can be accurately measured with high sensitivity, it is possible to provide a scanning electron microscope capable of accurately managing the charge progress of the electrostatic chuck by measuring the charge at least before the charge removal execution. In addition, according to another configuration, since the cumulative processed number or processing period until the next charge removal execution can be automatically reviewed according to the charge progress of the electrostatic chuck, it is possible to provide a scanning electron microscope in which transfer error or wafer breakage due to the residual chucking force are less likely to occur. Further, according to still another configuration, since the charge removal can be executed based on the cumulative processing time or the presence or absence of the residual chucking force in addition to the cumulative processed number, it is possible to provide a scanning electron microscope in which transfer errors or wafer breakage due to the residual chucking force is less likely to occur.

Figure 2:
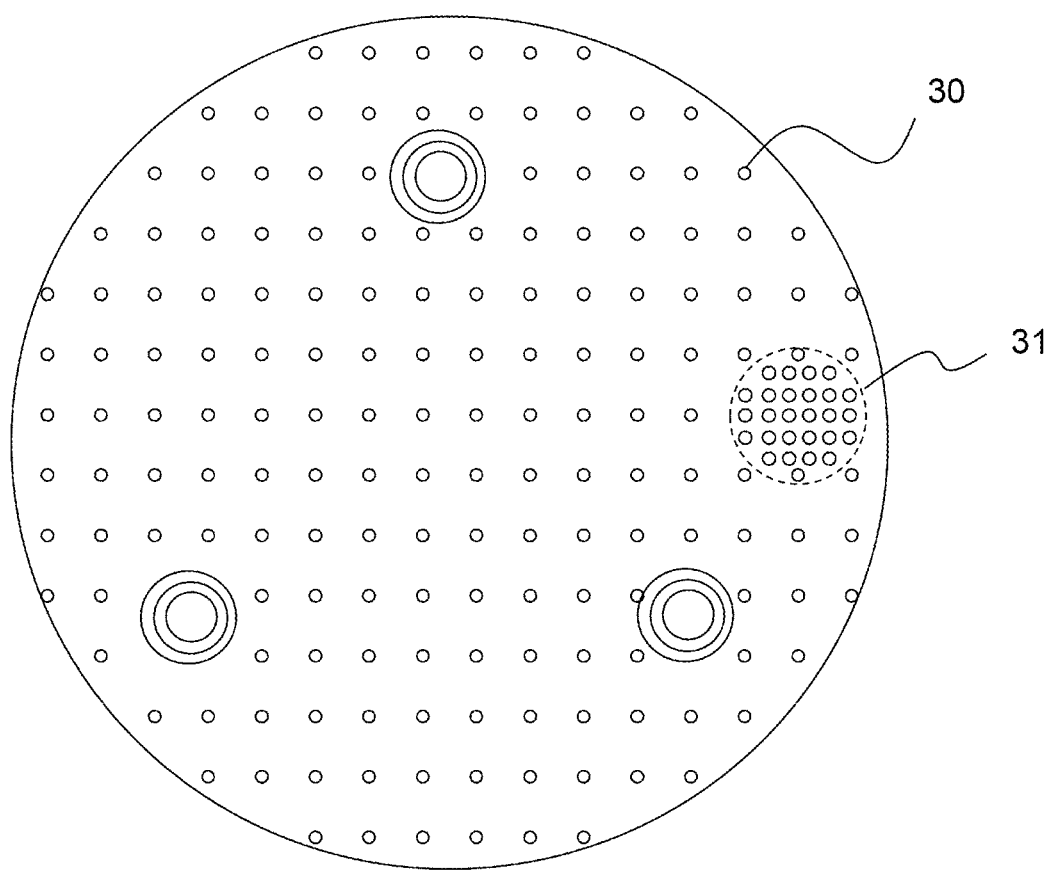
FIG. 2 is a view illustrating a structure of a sample chucking surface of an electrostatic chuck.
Figure 3:
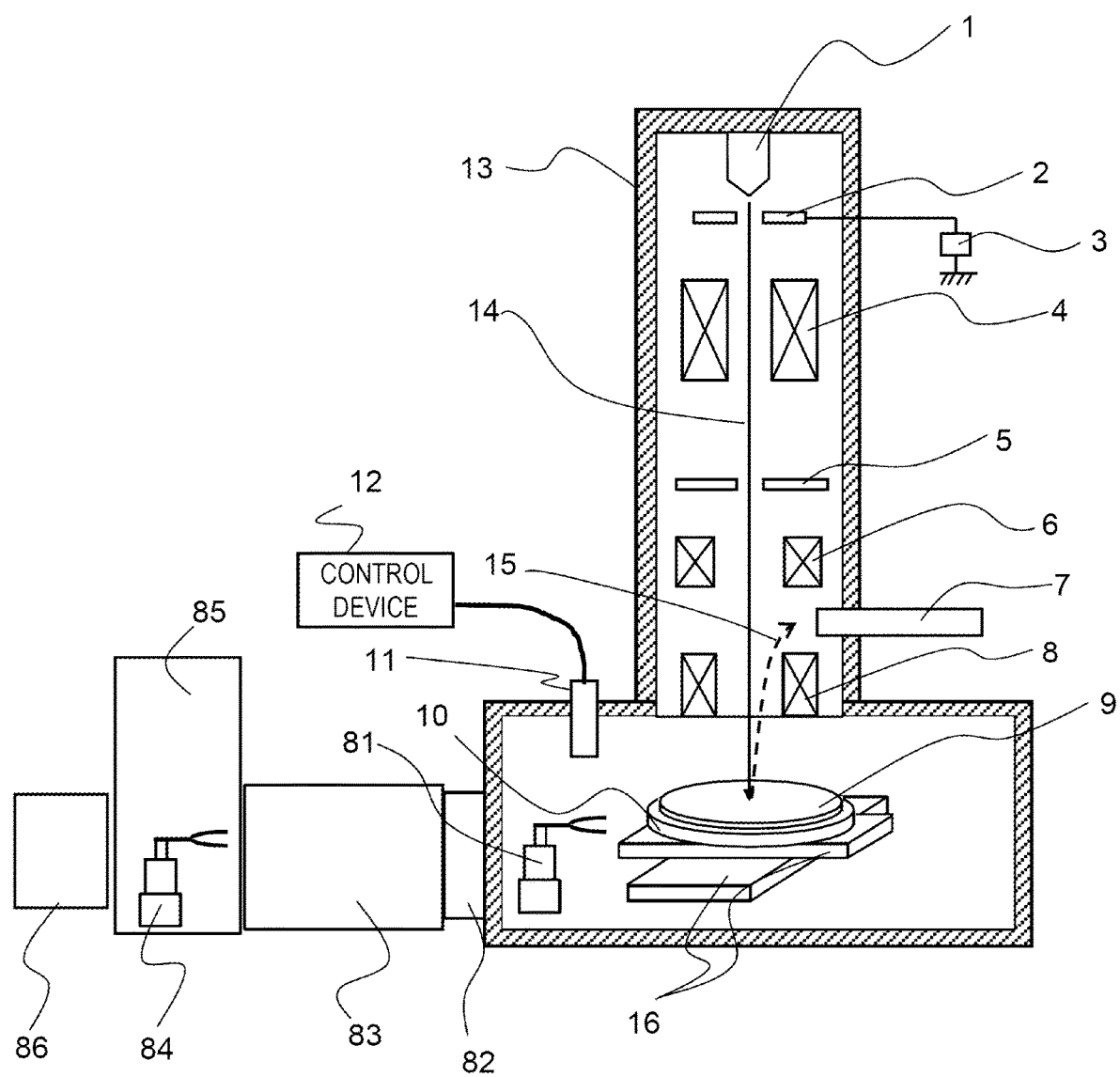
FIG. 3 is a view illustrating an outline of a CD-SEM.

A scanning electron microscope provided with an electrometer will be described below with reference to the drawings. First, a first embodiment will be described with reference to FIGS. 1 to 3. FIG. 1 is a flowchart, FIG. 2 is a top view of an electrostatic chuck, and FIG. 3 is a schematic view of a CD-SEM. As shown in FIG. 3, electrons emitted from an electron source 1 held in a housing 13 maintained at a high vacuum ($10^{-6}$ Pa or less) are accelerated by a primary electron acceleration electrode 2 to which a high voltage is applied by a high voltage power supply 3. An electron beam 14 (charged particle beam) is converged by an electron lens 4 for convergence. After a beam current amount is adjusted by a diaphragm 5, the electron beam is deflected by a scanning coil 6 and a wafer is two-dimensionally scanned with the electron beam. The electron beam is focused by an electron objective lens 8 disposed directly above a semiconductor wafer (hereinafter, simply referred to as a wafer) 9 serving as a sample, and incident on the wafer. Secondary electrons 15 generated as a result of incidence of primary electrons are detected by a secondary electron detector 7. Since an amount of the secondary electrons to be detected reflects a shape of a sample surface, the shape of the surface can be imaged based on information of the secondary electrons. The wafer 9 is held on an electrostatic chuck 10 while ensuring a certain flatness, and is fixed on an X-Y stage 16. In the drawing, the housing and an internal structure thereof are illustrated in a cross-sectional view as viewed from a lateral direction, and the X-Y stage, the electrostatic chuck and the wafer are illustrated in a perspective view so as to easily image an operation. Therefore, the wafer can be freely operated in both an X direction and a Y direction, and any position in a wafer surface can be measured. As illustrated in FIG. 2, a wafer transfer lift mechanism 32 is provided in which an elastic body 33 capable of moving up and down is incorporated in order to attach and detach the wafer to and from the electrostatic chuck, and the wafer can be transferred to and from a load chamber 83 by cooperative operation with a transfer robot 81.

In an operation of transferring the wafer to be measured to the electrostatic chuck, the wafer set in a wafer cassette 86 is first carried into the load chamber 83 by a transfer robot 84 in a mini-environment 85. An inside of the load chamber can be evacuated and released to the atmosphere by a not-shown evacuation system. By opening and closing a valve 82 and the operation of the transfer robot 81, the wafer is transferred onto the electrostatic chuck while maintaining the vacuum degree in the housing 13 at a practically acceptable level. A surface electrometer 11 is attached to the housing 13. The surface electrometer 11 is fixed at a position in a height direction where a distance from a probe tip is appropriate such that electric potential of a surface of the electrostatic chuck or the wafer can be measured without contact.

Figure 8:
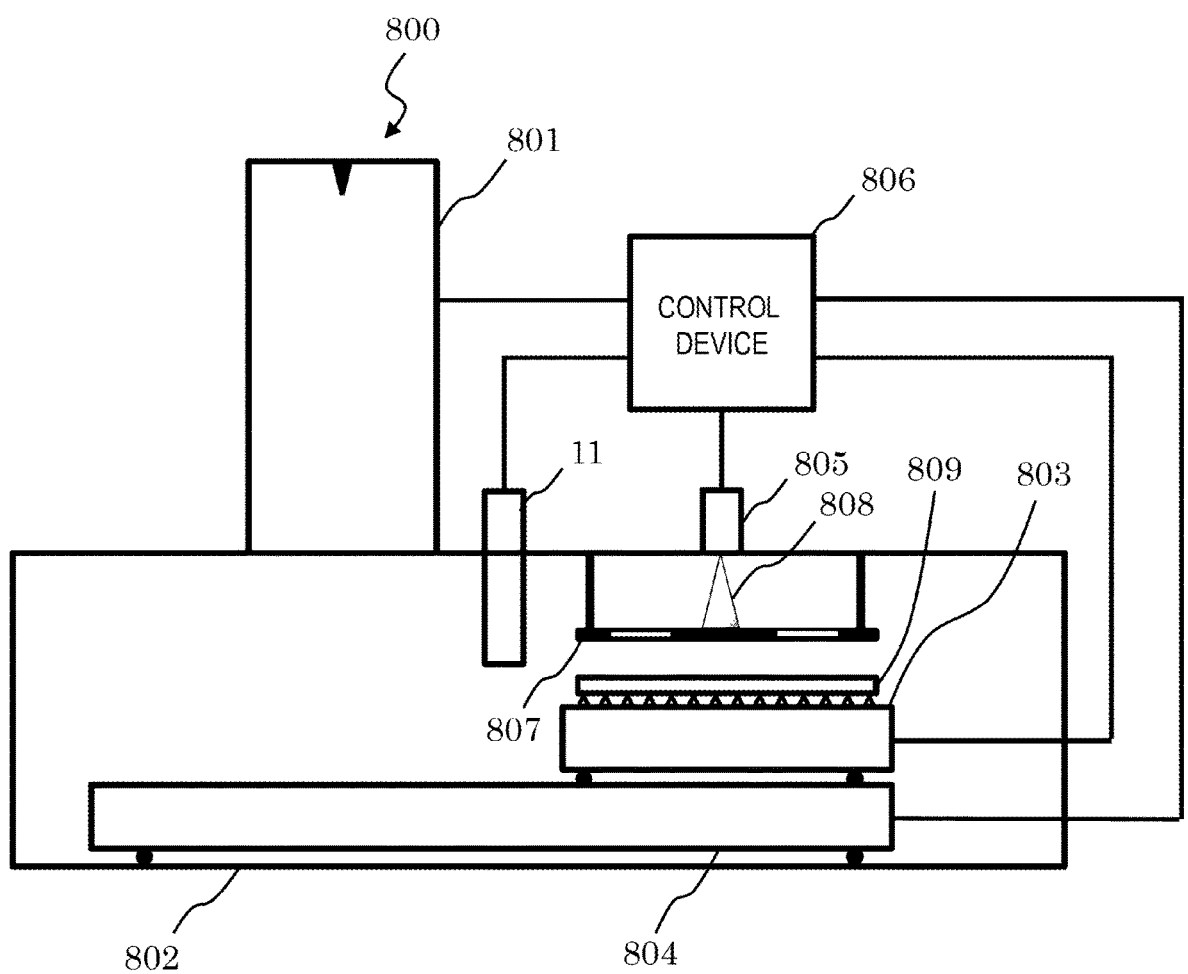
FIG. 8 is a view illustrating an example of a scanning electron microscope equipped with the charge removing device.

As illustrated in FIG. 8, the scanning electron microscope described in the embodiment is provided with an ultraviolet light source 805 as a charge removing device. A scanning electron microscope 800 illustrated in FIG. 8 is provided with an electron microscope column 801 including electron microscope optical elements such as an electron source, a lens and a deflector, and a stage 804 on which an electrostatic chuck 803 is mounted, the ultraviolet light source 805, a sample 809 or the surface electrometer 11 that measures electric potential of a sample chucking surface of the electrostatic chuck 803 are provided in a sample chamber 802. A control device 806 performs control such that the electric potential is measured at a timing (for example, in a case where the surface electric potential of the electrostatic chuck is measured, when the wafer is transferred to an outside of the sample chamber and after a predetermined number of wafer are measured) registered in advance by the electrometer 11, and the stage 803, the ultraviolet light source 804 and the like are controlled according to a control program stored in advance based on an output of the electrometer 11.

An object to be irradiated 807 is irradiated with ultraviolet light 808 from the ultraviolet light source 805, so that gas is ionized from the object to be irradiated, and charge removal is executed by the gas reaching the sample or the sample chucking surface of the electrostatic chuck. The charge removing device illustrated in FIG. 8 is only an example, and other charge removing devices may be applied.

As illustrated in FIG. 2, on the surface of the electrostatic chuck (sample chucking surface), a first region is formed in which projections 30 with spherical tops are arranged at certain pitches in order to prevent generation of inner surface foreign matters by avoiding direct contact with the wafer, and to properly manage contact heat transfer between the wafer and the electrostatic chuck. Each projection is generally in a hemispherical shape having a diameter Φ of 0.5 mm to 2 mm as viewed from above and a height of several μm to several tens of μm, in view of the electrostatic chucking force. In the embodiment, in order to improve measurement sensitivity when charge of the electrostatic chuck is measured by the surface electrometer, a high density region 31 (second region) is provided in which density of the projections is increased (the number of projections per unit area is relatively greater with respect to that of the first region) by reducing the pitches of the projections. By providing the region in which the density of the projections is increased in this manner, the measurement sensitivity of the charge of the chuck using the surface electrometer can be improved. This is because an actual contact between the wafer and the chuck is in an extremely small region of the projection, and the charges are distributed in an extremely small region, while the region to be measured by the surface voltmeter usually has a φ of about several mm. For this reason, for example, in a case where the measurement region of the surface electrometer has a Φ of 4 mm and the pitch of the projections is 5 mm, the charge cannot be measured with high sensitivity since only one projection enters the measurement region. Accordingly, in the embodiment, the pitch of the projections in the high density region is set to ⅓ and dot density is increased to 9 times, so that the sensitivity of the electric potential measurement by the surface electrometer can be improved and the charge can be accurately monitored. The control device 806 drives the stage and positions the surface electrometer 11 on the high density region 31 to execute charge measurement using the surface electrometer 11.

Figure 4:
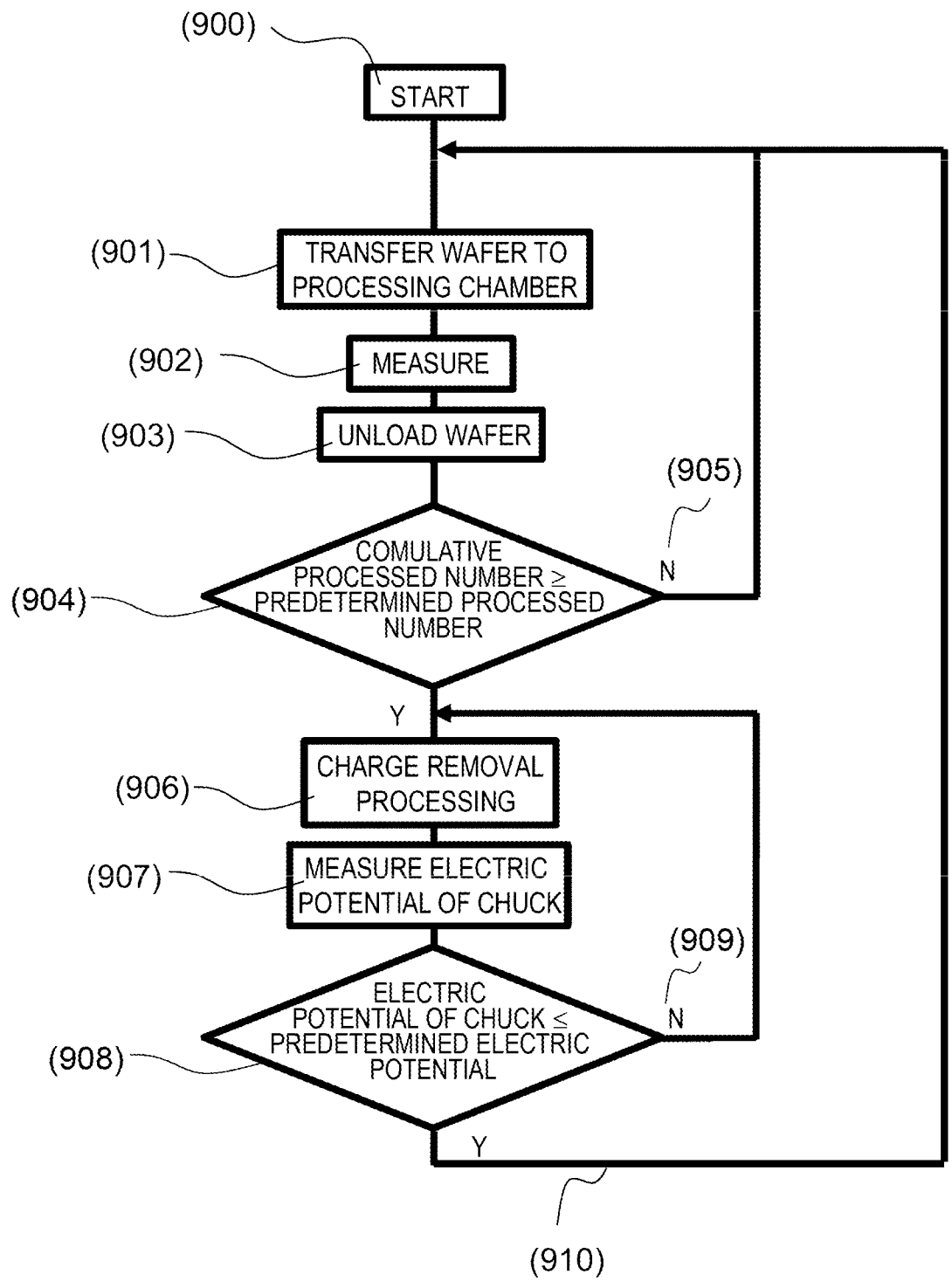
FIG. 4 is a flowchart showing steps of executing the charge removal on the electrostatic chuck when the number of processed samples reaches a predetermined number.

FIG. 4 is a flowchart showing steps of executing charge removal processing when a processed number of samples to be measured and examined reaches a predetermined number. This example describes an embodiment in which charge is monitored and removed periodically. After a recipe is started (900), the wafer is transferred to a processing chamber (sample chamber) (901). Measurement is executed based on a predetermined condition (902). The wafer is unloaded after the measurement is completed (903). Next, it is determined whether a cumulative processed number since the last charge removal processing is executed reaches a predetermined processed number (904). If No, a next wafer is transferred to the processing chamber and the measurement is repeated (905). If Yes, the charge removal in the processing chamber is executed using the above-mentioned charge removing mechanism (906). After the execution, a surface of the electrostatic chuck is measured by the surface electrometer (907). In a case where electric potential is within a reference electric potential as a result of the measurement, it is determined that the charge removal is completed, and the process proceeds to processing of the next wafer (910). On the other hand, in a case where the electric potential does not satisfy the reference, the charge removal is repeated until the charge removal is completed again (909).

In a case where the charge removal is executed through the steps shown in FIG. 4, the charge removal processing is executed after the predetermined processed number is reached, for example, when a level of the charge remained by a residual chucking force is 50 V, so that the processing can be stably continued as long as the cumulative processed number is appropriately set. However, in an actual semiconductor manufacturing line, a state of the wafer introduced into the CD-SEM varies from wafer to wafer, and when a manufacturing process changes, a charge state of the electrostatic chuck also changes.

For example, when temperature of the wafer introduced to the device changes, thermal contraction of the wafer changes and accordingly degree of friction between the wafer and projections of the electrostatic chuck changes, so that the charge state changes. Therefore, in a case where the cumulative processed number is initially set to be 100, when the charge reaches 50 V by 80 wafers, the processing of the remaining 20 wafers is continued in a state where transfer may be inhibited due to residual chucking or the like, in which case, the device may stop due to transfer errors or the wafer may be damaged.

A scanning electron microscope that executes charge removal at an appropriate timing will be described below. The control device 806 is provided with an arithmetic unit built therein that executes control and operation of the device as described below, and charge removal processing or the like is executed at a timing appropriately set in accordance with a predetermined operation program. FIG. 1 shows a sequence of automatically adjusting an interval of charge monitoring to execute the charge removal. After the processing is started (100), the wafer is transferred to the processing chamber (101). Measurement is executed based on a predetermined condition (102). The wafer is unloaded after the measurement is completed (104). Next, it is determined whether a cumulative processed number since the last charge removal processing execution reaches a processed number determined after completion of the last charge removal processing (105). When No, a next wafer is transferred to the processing chamber and the measurement is repeated (106).

If Yes, the stage is moved to a position where the surface electrometer can measure a projection dense region of the electrostatic chuck (107), and electric potential of the electrostatic chuck is measured (108). Then, the charge removal processing is executed (109), and the stage is moved again to measure the electric potential of the electrostatic chuck after the charge removal (110). When the electric potential is within a reference electric potential (111), it is determined that the charge removal is completed, and the process proceeds to processing of the next wafer. On the other hand, in a case where the electric potential does not satisfy the reference, the charge removal is repeated until the charge removal is completed again (112). Although not shown, an upper limit is provided for the number of times of repeating the charge removal, and in a case where the charge removal is not completed even after a certain number of executions are performed, it is determined that an abnormality may occur, and the device is stopped to prevent an accident.

Next, a state of charge progress during a period from completion of the last charge removal to the current charge removal execution is determined (113). In the embodiment, a value obtained by dividing electric potential of the electrostatic chuck Vn_pre measured before the charge removal execution by a cumulative processed number Nw is taken as a charge speed Vsp and used as an index of the charge. When the charge speed Vsp exceeds a predetermined reference value 1 (114 (when a predetermined condition is not satisfied) or when the charge speed is equal to or larger than the reference value 1, the cumulative processed number until the next charge removal is reduced only by a predetermined number a (117), and the process proceeds to the next processing (120). When Vsp does not reach the predetermined value (115) and does not reach a predetermined reference value 2 (when the predetermined condition is not satisfied), or when Vsp is equal to or less than the reference value 2, it can be determined that no charge is generated or effects of the generated charge can be ignored, so that the cumulative processed number until the next charge removal is increased only by the predetermined number b (118), and the process proceeds to the next processing (120). When Vsp is larger than the reference value 2 and less than the reference value 1 (when Vsp is within a predetermined range (condition)), it can be determined that an current interval between charge removal executions is appropriate, so that the cumulative processed number Nw is maintained (119), and the process proceeds to the next processing (120). These parameters, that is, upper and lower limit values of the charge speed, and the numbers a and b for reviewing the cumulative processed number are managed by a file in the control device of the device. Although Vn_pre described above indicates degree of the charge progress (speed) during processing of one wafer, the charge speed may be evaluated based on a value indicating the charge progress in n units (n>1) (a value indicating the charge in predetermined processing units).

According to the first embodiment configured in this manner, the charge state can be monitored with high sensitivity in a short time by measuring the electric potential at one location of the projection dense region provided on the electrostatic chuck before the charge removal execution, and the interval until the next charge removal execution is automatically adjusted based on the measurement result, so that charge removal is always executed for each appropriate cumulative processed number even in a case where the charge state of the electrostatic chuck changes as the state of the wafer introduced to the device changes. Therefore, it is possible to provide a scanning electron microscope capable of avoiding transfer errors and wafer breakage due to residual chucking.

In the embodiment, parameters for reviewing the cumulative processed number are a and b, but the invention is not limited thereto. For example, it is also effective to divide a reviewing number when the charge speed exceeds the upper limit value Vsp_u according to the charge speed. For example, when the introduced wafer causes gas release, since the charge speed may be rapidly increased, the charge removal processing is preferably executed at shorter intervals in such a case.

In the embodiment, the timing of charge removal execution is determined only by the cumulative processed number. However, the number of times of charge removal executions can also be managed using information related to the cumulative processing time and the presence or absence of residual chucking in addition to the cumulative processed number. Information indicating the charge of the electrostatic chuck includes a residual chucking force itself, a signal generated in a power supply circuit when the wafer is peeled off in the presence of the residual chucking force, and variations in transfer accuracy caused by peeling off the wafer in the presence of the residual chucking force.

For example, the residual chucking force can be detected by incorporating a strain sensor in a drive mechanism that lifts up the wafer and monitoring an output of the strain sensor when the wafer is peeled off from the electrostatic chuck.

Next, in the signal generated in the power supply circuit, for example, polarized charge is generated in a dielectric film of the electrostatic chuck when residual chucking is generated, so that a voltage fluctuation occurs on an internal electrode of the electrostatic chuck when the wafer is peeled off against the residual chucking force. Therefore, when the voltage fluctuation across a resistor incorporated in the circuit that applies a voltage to the internal electrode is monitored, the presence or absence of the residual chucking and degree thereof can be estimated. In this case, a charge removal condition is preferably adjusted such that when a value for evaluating the residual chucking force is equal to or larger than a predetermined value, or exceeds the predetermined value, the processed number is preferably reduced; when the value is less than the predetermined value, the processed number is preferably increased.

Since a position sensor is usually provided on a wafer transfer path in the device in order to stably operate the device, the variations in transfer accuracy can be detected by monitoring changes in transfer accuracy of the wafer. That is, in a case where the wafer is peeled off against the residual chucking force when the residual chucking force is generated, the wafer bounces due to reaction at the moment when the wafer is peeled off, so that the transfer accuracy is degraded by several tens of μm to several mm. When a threshold value is provided therefor, the timing of the charge removal can be determined. Which signal is to be selected may be appropriately determined in view of the device configuration.

The above embodiment describes an example in which a command to execute charge removal is issued when the processed number of wafers (the number of wafers to be measured) is counted and the counted number reaches the predetermined value (reference value) after the charge removal is performed. However, the command for charge removal may be generated based on counting of the processing time. In this case, when the predetermined time is reached, the measurement processing of the wafer is executed, and since the surface electric potential measurement and the charge removal processing may not able to be executed immediately, the process preferably proceeds to the charge removal processing when two conditions of reaching the predetermined processing time and completion of the wafer processing are both satisfied. In a storage medium (not shown), a time to be subtracted from an initial value when the charge speed exceeds a predetermined value, and a time to be added to the initial value when the charge speed is equal to or below a predetermined value are registered, so that the charge removal can be executed at an appropriate timing.

Figure 5:
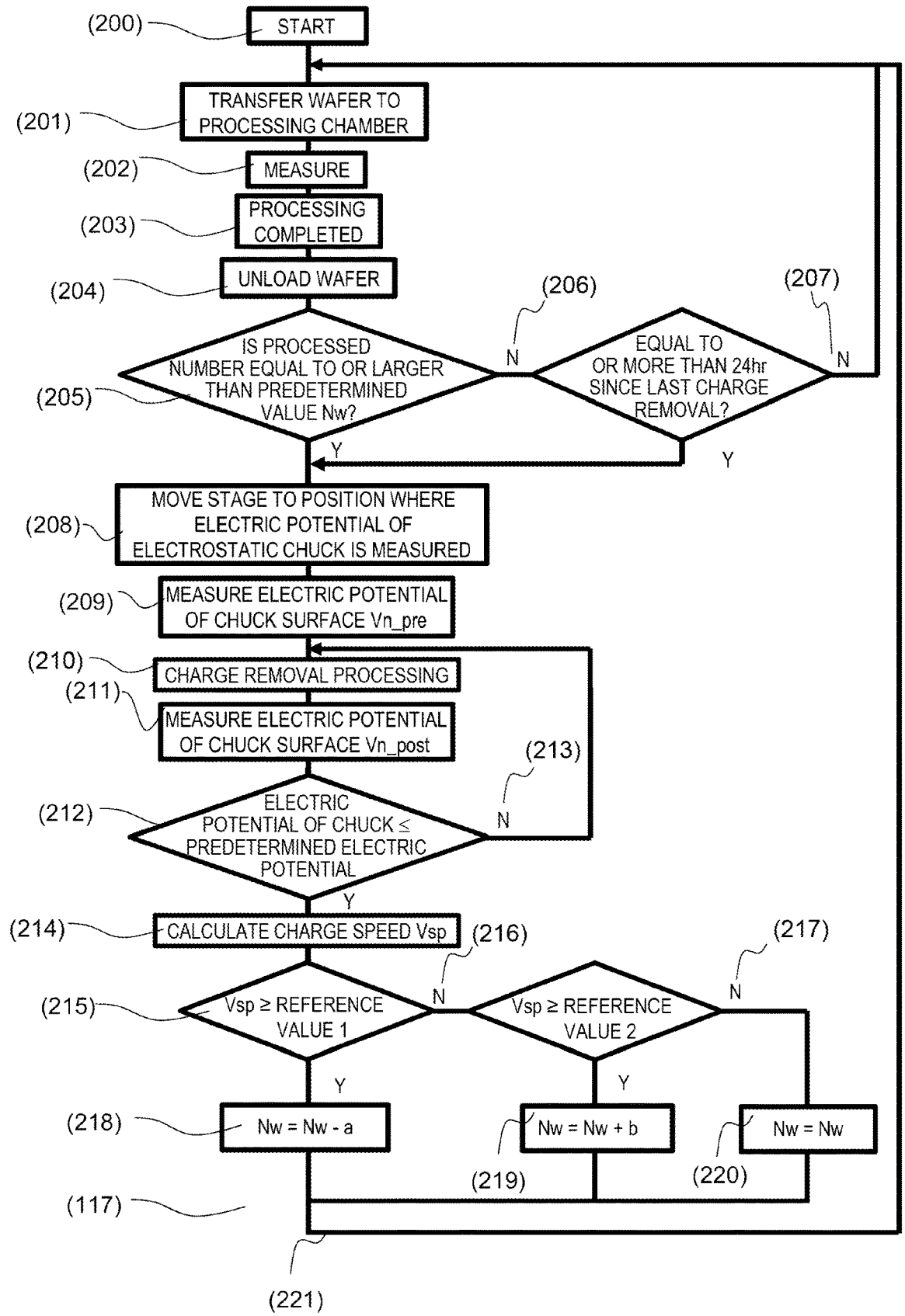
FIG. 5 is a flowchart showing steps of adjusting a charge removal timing using a charge removing device according to a charge speed (second embodiment).

Hereinafter, an embodiment will be described in which the cumulative processed number and time, and the cumulative processed number and residual chucking signal are used in combination. FIG. 5 shows an example in which the time is used in combination, which is the second embodiment. After processing is started (200), the wafer is transferred to the processing chamber (201). Measurement is executed based on a predetermined recipe (202). The wafer is unloaded after the measurement is completed (204). Next, it is determined whether the cumulative processed number since the last charge removal processing execution reaches the processed number determined after completion of the last charge removal processing (205). If Yes, the charge removal is executed as in the first embodiment (210), a charge speed is calculated (214) to determine a charge state, and the cumulative processed number before the next charge removal execution is reviewed as necessary (218 to 220).

In the embodiment, when the number processed number does not reach the cumulative processed number set in advance (206), it is determined whether a predetermined time has elapsed since the last charge removal execution. For example, in a case where the predetermined time is determined to be 24 hours in advance, the charge removal processing is executed if 24 hours has elapsed even in a case where the cumulative processed number does not reach the predetermined number. This is effective in preventing transfer errors, for example, in a case where a large number of chips built in one wafer are all measured, and a slight leak current due to chucking by the electrostatic chuck for a long time causes the surface of the electrostatic chuck to be charged.

In the embodiment, the determination is performed based on the time elapsed since the last charge removal execution as a time reference. However, the invention is not limited thereto. For example, it is also possible to manage by the cumulative time when a voltage is applied to the electrostatic chuck. Further, in addition to automatically updating the cumulative processed number as in the first embodiment, more reliable operation is enabled if the elapsed time is reviewed based on a result of the charge speed.

Figure 6:
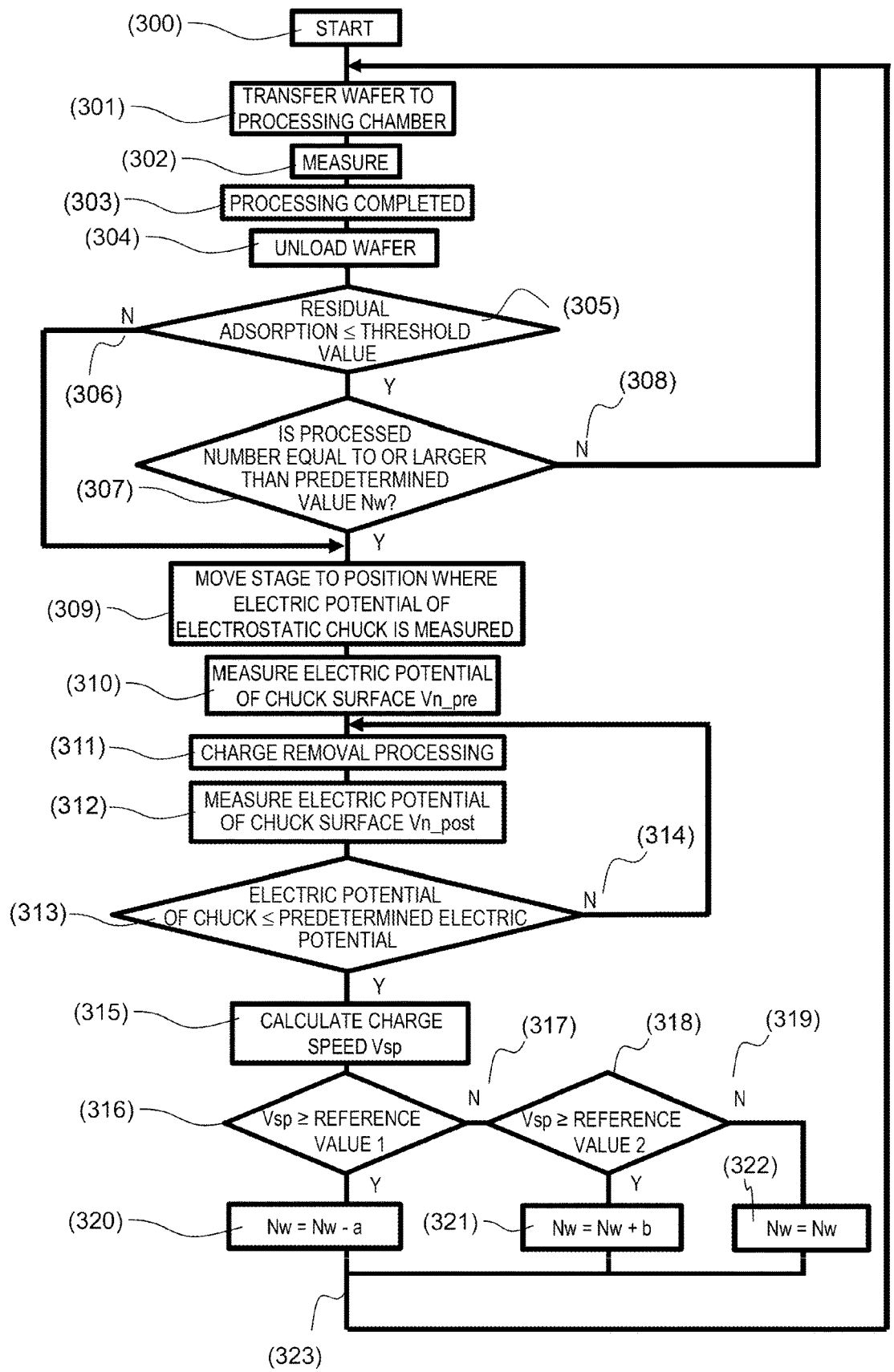
FIG. 6 is a flowchart showing steps of a adjusting a charge removal timing using a charge removing device according to a charge speed (third embodiment).

FIG. 6 shows an example in which the residual chucking force signal is used in combination, which is the third embodiment. When processing is started, the wafer is transferred to the processing chamber. Measurement is executed based on a predetermined recipe. The wafer is unloaded after the measurement is completed. At this time, it is determined whether a residual chucking force is generated by measuring with any of the above-described means (305). When the residual chucking force is equal to or larger than a threshold value (306), charge removal is executed in the same manner as in the first embodiment, a charge speed is calculated to determine a charge state, and the cumulative processed number until the next charge removal execution is reviewed as necessary. When generation of the residual chucking force is not recognized, similarly to the first embodiment, it is determined whether the cumulative processed number since the last charge removal processing execution reaches the processed number determined after completion of the last charge removal (307). If Yes, the charge removal is executed similarly to the first embodiment, a charge speed is calculated to determine a charge state, and the cumulative processed number until the next charge removal execution is reviewed as necessary.

According to the method of the embodiment, transfer errors can be effectively prevented even if the electrostatic chuck is charged unexpectedly due to discharge of gas released from the wafer, for example, in addition to the usual gradual charge progress.

In the second and third embodiments, the examples are described in which the time and the residual chucking force are respectively combined with the first embodiment, and all the references may be combined. In this case, more reliable operation is enabled. It should be appropriately selected according to a state of the wafer to be transferred, the processed number and an environment to which the device is applied.

Figure 7:
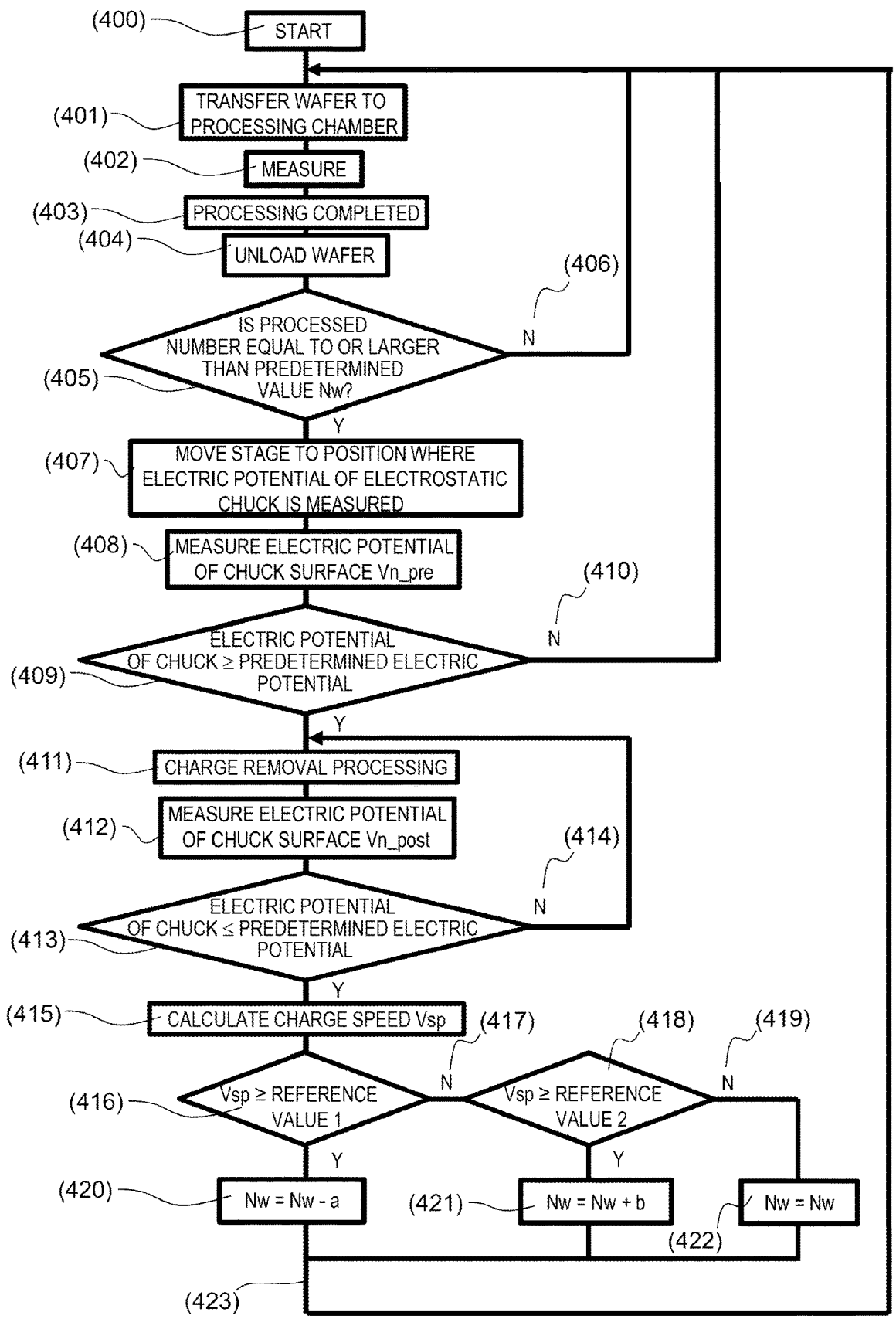
FIG. 7 is a flowchart showing steps of adjusting a charge removal timing using a charge removing device according to a charge speed (fourth embodiment).

Although the charge removal is always executed after the charge is measured by the surface electrometer in the embodiments, the invention is not limited thereto. FIG. 7 shows a sequence example of a fourth embodiment. In the embodiment, after the cumulative processed number reaches a predetermined processed number (405), in a case where a result of charge measurement by the surface electrometer (408) shows that the charge is not substantially charged (410), the process proceeds to measurement of the next wafer without charge removal. In this case, since the time spent for unnecessary charge removal can be eliminated, a scanning electron microscope with higher productivity can be provided.

The result of the electric potential measurement may be stored in a predetermined storage medium built in the control device, and then a charge state of the device may be analyzed.

REFERENCE SIGN LIST 1 electron source, 2 primary electron acceleration electrode, 3 high voltage power supply, 4 electron lens, 5 diaphragm, 6 scanning coil, 7 secondary electron detector, 8 electron objective lens, 9 wafer, 10 electrostatic chuck, 11 surface electrometer, 12 control device, 13 housing, 14 electron beam, 15 secondary electron, 16 X-Y stage, 26 circular internal electrode, 27 DC power supply, 28 DC power supply, 29 retarding power supply, 30 projection, 31 high density region, 81 transfer robot, 82 valve, 83 load chamber, 84 transfer robot, 85 mini-environment, 86 wafer cassette

The invention claimed is:

1. A charged-particle beam device equipped with an electrostatic chuck that chucks a sample to be irradiated with a charged particle beam, the charged-particle beam device comprising:
   an electrometer that measures electric potential of the electrostatic chuck;
   a charge removing device that removes charge from the electrostatic chuck; and
   a control device that controls the charge removing device in such a manner that charge removal by the charge removing device is executed after reaching a predetermined processed number of samples irradiated by the charged particle beam, or after a predetermined processing time, wherein
   the control device executes at least one among increasing and decreasing the processed number or processing time when a result of electric potential measurement by the electrometer does not meet a predetermined condition.

2. The charged-particle beam device according to claim 1, wherein
   the control device executes at least one among increasing and decreasing the processed number or processing time when a value indicating a charge amount per unit processed number or unit processing time is out of a predetermined range.

3. The charged-particle beam device according to claim 2, wherein
   the control device calculates the charge amount per unit processed number or unit processing time, and decreases the processed number or processing time when the charge amount is equal to or larger than a predetermined value or when the charge amount exceeds the predetermined value.

4. The charged-particle beam device according to claim 2, wherein
   the control device calculates the charge amount per unit processed number or unit processing time, and increases the processed number or processing time when the charge amount is equal to or less than the predetermined value or when the charge amount does not reach the predetermined value.

5. The charged-particle beam device according to claim 1, further comprising:
   a lift pin that lifts the sample from the electrostatic chuck; and
   an evaluation device that evaluates an chucking force when the sample is lifted from the electrostatic chuck using the lift pin, wherein
   at least one among increasing and decreasing the processed number or processing time is executed in a case where a result of evaluation by the evaluation device does not meet a predetermined condition.

6. The charged-particle beam device according to claim 1, wherein
   the control device executes charge removal processing using the charge removing device when the predetermined processing time is reached before reaching the predetermined processed number.

7. The charged-particle beam device according to claim 1, further comprising:
   a lift pin that lifts the sample from the electrostatic chuck; and
   an evaluation device that evaluates an chucking force when the sample is lifted from the electrostatic chuck using the lift pin, wherein
   in a case where a result of evaluation by the evaluation device does not meet a predetermined condition, the control device executes charge removal processing using the charge removing device even if the processed number or processing time is not reached.

8. The charged-particle beam device according to claim 1, wherein
   the control device introduces a new sample into a sample chamber provided in the charged-particle beam device without executing the charge removal using the charge removing device in a case where the result of the electric potential measurement by the electrometer is equal to or less than a predetermined value, or does not reach the predetermined value.

9. The charged-particle beam device according to claim 1, wherein
   a sample chucking surface of the electrostatic chuck includes a first region in which a plurality of projections are formed and a second region in which the number of projections per unit area is larger than that of the first region, and the control device measures electric potential of the second region using the electrometer.

10. The charged-particle beam device according to claim 1, wherein
   the control device measures electric potential before and after the charge removal using the charge removing device, and stores the electric potential in a predetermined storage medium.

11. A charged-particle beam device equipped with an electrostatic chuck that chucks a sample to be irradiated with a charged particle beam, the charged-particle beam device comprising:
   a stage that moves the electrostatic chuck;
   an electrometer that measures electric potential of the electrostatic chuck; and
   a control device that controls the stage and the electrometer, wherein
   a sample chucking surface of the electrostatic chuck includes a first region in which a plurality of projections are formed and a second region in which the number of projections per unit area is larger than that of the first region, and the control device controls the stage and the electrometer so as to measure electric potential of the second region.

\* \* \* \* \*